US010163379B2

(12) United States Patent
Mao et al.

(10) Patent No.: US 10,163,379 B2
(45) Date of Patent: Dec. 25, 2018

(54) DETECTION DEVICE, DETECTION METHOD AND DETECTION SYSTEM

(71) Applicants: BOE TECHNOLOGY GROUP CO., LTD., Beijing (CN); BEIJING BOE DISPLAY TECHNOLOGY CO., LTD., Beijing (CN)

(72) Inventors: Jiyu Mao, Beijing (CN); Ran Zhang, Beijing (CN)

(73) Assignees: BOE Technology Group Co., LTD., Beijing (CN); Beijing BOE Display Technology Co., LTD., Beijing (CN)

( * ) Notice: Subject to any disclaimer, the term of this patent is extended or adjusted under 35 U.S.C. 154(b) by 517 days.

(21) Appl. No.: 14/802,677

(22) Filed: Jul. 17, 2015

(65) Prior Publication Data

US 2016/0084881 A1 Mar. 24, 2016

(30) Foreign Application Priority Data

Sep. 24, 2014 (CN) .......................... 2014 1 0495906

(51) Int. Cl.
*G09G 3/00* (2006.01)
*G01R 1/067* (2006.01)

(52) U.S. Cl.
CPC .................................... *G09G 3/006* (2013.01)

(58) Field of Classification Search
CPC ......... B82Y 35/00; B82Y 10/00; B82Y 20/00; G01Q 10/04
USPC .................................. 700/28, 180, 192, 197
See application file for complete search history.

(56) References Cited

U.S. PATENT DOCUMENTS

| | | | | |
|---|---|---|---|---|
| 6,079,255 A * | 6/2000 | Binnig | G01Q 70/10 73/105 |
| 2005/0223785 A1* | 10/2005 | Watanabe | B82Y 35/00 73/105 |
| 2007/0033991 A1* | 2/2007 | Rice | B82Y 35/00 73/105 |
| 2008/0073522 A1* | 3/2008 | Takaoka | G03F 1/72 250/306 |
| 2010/0186132 A1* | 7/2010 | Humphris | B82Y 35/00 850/1 |
| 2010/0288033 A1* | 11/2010 | Mizutani | G01B 5/0016 73/105 |

* cited by examiner

*Primary Examiner* — Jonathan Han
(74) *Attorney, Agent, or Firm* — Nath Goldberg & Meyer; Joshua B. Goldberg

(57) ABSTRACT

The present invention provides a detection device, a detection method and a detection system, which are used for detecting damaged condition of a substrate. The detection device includes a probe unit and a judgement unit, and the probe unit includes a probe, a speed detection module and a driving force control module both provided on the probe, wherein the bottom end of the probe is used for contacting with the substrate to be detected; the speed detection module is used for obtaining a real-time speed of the probe in a process of detection and transmitting the real-time speed to the judgement unit; the driving force control module is used for applying a constant driving force to the probe; and the judgement unit is used for receiving the real-time speed of the probe and judging the damaged condition of the substrate to be detected according to the real-time speed.

11 Claims, 3 Drawing Sheets

DETECTION DEVICE, DETECTION METHOD AND DETECTION SYSTEM

FIELD OF THE INVENTION

The present invention relates to the field of display technology, and particularly, relates to a detection device, a detection method and a detection system, for detecting damaged condition of a substrate.

BACKGROUND OF THE INVENTION

With development of display technology, flat display devices have become mainstream products in people's lives. Liquid crystal display (LCD for short) device is one of them. Taking a liquid crystal display device as an example, it includes a color filter substrate and an array substrate. During manufacturing the color filter substrate or the array substrate, a layer of film is formed on a base, and then a patterning process is performed on the layer of film, so as to form a predetermined pattern; subsequently, another layer of film is formed on the predetermined pattern, so as to form another layer of pattern. Above steps are repeated until the color filter substrate or the array substrate is formed.

Currently, base of the color filter substrate or array substrate is generally made of glass material. When transporting the base in production line, it is likely to be damaged due to various reasons. There are generally two damaged conditions, one is film damage (i.e., only the film on the base has been damaged), and the other is base damage (i.e., not only the film on the base has been damaged, the glass base itself has also been damaged). For different damaged conditions, different solutions have been employed, for example, the substrate with damaged film is reworked, so as to reuse the glass base, and however, when the glass base itself has been damaged, the damaged glass base has to be rejected immediately, as subsequent important apparatuses having high precision and high cost (e.g., coating machine and exposing machine) may be contaminated by glass fragments produced by the damaged glass base due to vibration of the production line.

Currently, a widely used method to distinguish film damage and base damage is as follows: as shown in FIG. 1, irradiating a substrate within a macro detection machine by an intense light source, and observing and determining damaged condition of the substrate by human eyes. By employing this method, apparent film damage (slightly damaged condition) and apparent base damage (severely damaged condition) can be distinguished. However, when damaged condition is moderate, it is hardly to be distinguished, by human eyes, whether the damaged condition is the film damage or the base damage, so that it is likely to make a wrong judgement. As a result, glass fragments are produced by the substrate judged as a substrate having film damage, the base of which has been damaged, in the subsequent processes, which will lead to a serious problem of the production line.

Thus, designing a detection device and a detection method for accurately detecting damaged condition of a substrate has become a technical problem to be solved urgently.

Herein, "damaged condition" refers to depth of damage from film side of a substrate to be detected.

SUMMARY OF THE INVENTION

In view of the above technical problem in the prior art, embodiments of the present invention provide a detection device for detecting damaged condition of a substrate, a detection method and a detection system, which can accurately detect the damaged condition of the substrate, so as to ensure that the substrate with a damaged base will not go through the subsequent production line and prevent the important apparatuses in the production line from being affected by the substrate with the damaged base.

As an aspect of the present invention, there is provided a detection device for detecting damaged condition of a substrate, the substrate to be detected includes a base and a film provided on the base, the detection device includes a probe unit and a judgement unit, and the probe unit includes a probe, a speed detection module and a driving force control module both provided on the probe, wherein the bottom end of the probe is used for contacting with the substrate to be detected; the speed detection module is used for obtaining a real-time speed of the probe in a process of detection and transmitting the real-time speed to the judgement unit; the driving force control module is used for applying a constant driving force to the probe; and the judgement unit is used for receiving the real-time speed of the probe and judging the damaged condition of the substrate to be detected according to the real-time speed of the probe.

The probe unit may further include a position obtaining module, which is used for obtaining a position where the probe just contacts with the substrate to be detected, so that a plane including the position and parallel to the surface of the substrate to be detected is served as a reference plane, which is an initial plane when a position to be detected of the substrate to be detected is detected by using the probe.

The judgement unit may be stored in advance with a speed information table, which has a speed range of the probe under a single driving force condition; alternatively, the speed information table further has a plurality of speed ranges of the probe under a plurality of driving force conditions respectively.

The speed range under one or a plurality of driving force conditions in the speed information table may be obtained by the following steps of:

preparing a plurality of sample substrates not provided with a film and without damage and a plurality of sample substrates provided with a film and without damage;

determining a value of a driving force, wherein when the probe is driven by the driving force having the value to move toward the sample substrate not provided with a film and without damage, the sample substrate not provided with a film and without damage will not be damaged when the probe contacts with the sample substrate;

driving, under the driving force having the value, the probe to move toward the sample substrate provided with a film and without damage and penetrate through the film;

obtaining, under the driving of the driving force having the value, a plurality of speeds of the probe moving within films made of different materials respectively, so as to form a speed range; and storing the value of the driving force in the speed information table in association with the speed range.

The probe may be made of a diamond material.

As another aspect of the present invention, there is further provided a detection system for detecting damaged condition of a substrate, which includes the above detection device.

The detection system may include an operation station, wherein the probe unit of the detection device is provided at the front end of the operation station and can move freely in two directions vertical to each other with respect to the operation station.

As still another aspect of the present invention, there is provided a detection method for detecting damaged condition of a substrate, the substrate to be detected includes a base and a film provided on the base, and the method includes the following steps of:

S1, applying a preset driving force to a probe, so that the probe moves toward the substrate to be detected in a direction vertical to the surface of the substrate to be detected;

S2, obtaining the speed of the probe in the process of detection; and

S3, judging the damaged condition of the substrate to be detected according to the obtained speed.

Before the step of S1, the method may further include a step of determining a damaged position of the substrate to be detected; correspondingly, in the step of S1, the probe moves to a position right above the damaged position and then moves toward the substrate to be detected, and in the step of S2, the speed of the probe is its speed at the damaged position of the substrate to be detected.

Before the step of S1, the method may further include steps of:

applying the same preset driving force as applied in the step of S1 to the probe, so that the probe moves toward an undamaged area of the substrate to be detected in the direction vertical to the surface of the substrate to be detected, recording a position where the probe just contacts with the substrate to be detected, and using a plane including the position and parallel to the surface of the substrate to be detected as a reference plane; and the probe moves within the reference plane to a position right above the damaged position, and correspondingly, the probe moves toward the damaged position of the substrate to be detected in the step of S1.

Before the step of S1, the method may further include a step of forming a speed information table, which has a speed range of the probe under a single driving force condition or has a plurality of speed ranges of the probe under a plurality of driving force conditions respectively, wherein formation of the speed information table includes steps of:

preparing a plurality of sample substrates not provided with a film and without damage and a plurality of sample substrates provided with a film and without damage;

determining a value of a driving force, wherein when the probe is driven by the driving force having the value to move toward the sample substrate not provided with a film and without damage, the sample substrate not provided with a film and without damage will not be damaged when the probe contacts with the sample substrate;

driving, under the driving force having the value, the probe to move toward the sample substrate provided with a film and without damage and penetrate through the film;

obtaining, under the driving of the driving force having the value, a plurality of speeds of the probe moving within films made of different materials respectively, so as to form a speed range; and storing the value of the driving force in association with the speed range, so as to form the speed information table.

Correspondingly, in the step of S3, the damaged condition of the substrate to be detected is judged according to the obtained speed by referring to the speed information table.

The damaged condition of the substrate to be detected is judged to be film damage and the base is not damaged, in a case where the speed of the probe is changed to 0 after being subject to the speed range, in the speed information table, corresponding to the value of the driving force which drives the probe; and the damaged condition of the substrate to be detected is judged to be base damage, in a case where the speed of the probe is directly changed to 0.

The beneficial effects of the present invention are as follows.

According to the detection device and detection method for detecting damaged condition of the substrate provided by embodiments of the present invention, whether the damaged condition of the substrate is film damage or base damage can be determined accurately by detecting the variation of the speed of the probe in the process of detection under a constant driving force condition. The detection device has a simple structure, the detection method is convenient, prompt and accurate, and the impacts on the important apparatuses caused by the substrate having a damaged base can be prevented.

DETAILED DESCRIPTION OF THE EMBODIMENTS

To make those skilled in the art better understand the technical solutions of the present invention, a detection device, a detection method and a detection system of the present invention, which are used for detecting damage condition of a substrate, will be described in detail below in conjunction with the accompanying drawings and specific implementations.

First Embodiment

The present embodiment provides a detection device for detecting damaged condition of a substrate.

Figure 2:
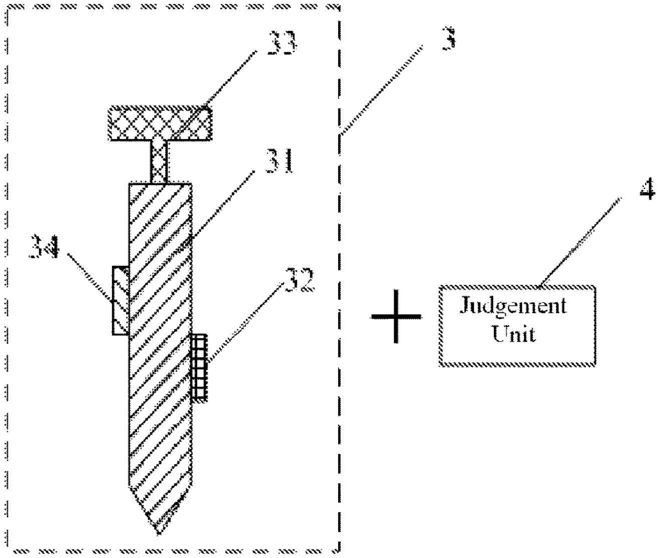
FIG. 2 is a structural diagram of a detection device for detecting damaged condition of a substrate in a first embodiment of the present invention.

In the present embodiment, a substrate to be detected includes a base and a layer of film provided on the base, and generally, the substrate to be detected is a substrate having been damaged but whether the damaged condition thereof is film damage or base damage cannot be determined. As shown in FIG. 2, the detection device for detecting damaged condition of a substrate includes a probe unit 3 and a judgement unit 4.

The probe unit 3 includes a probe 31, a speed detection module 32 and a driving force control module 33 both provided on the probe 31. The bottom end of the probe 31 is used for contacting with the substrate to be detected; the speed detection module 32 is used for obtaining a real-time speed of the probe 31 in a process of detection and transmitting the real-time speed to the judgement unit 4; and the driving force control module 33 is used for applying a constant driving force to the probe 31, so as to drive the probe 31 to move.

The judgement unit 4 is used for receiving the real-time speed of the probe 31 and judging the damaged condition of the substrate to be detected according to the real-time speed of the probe 31.

The probe 31 may be made of a diamond material. Diamond has advantages of high hardness, non-conductive, wear-resistance, non-magnetic, and the like, and can ensure the accuracy of the obtained speed of the probe 31.

The driving force control module 33 is used for applying a constant driving force to the probe 31. For example, a driving force controller may be used as the driving force control module 33. As the probe 31 is of high hardness, the probe 31 can penetrate through a film under driving of a certain driving force. It can be understood that, for films made of various materials, the speed of the probe 31 penetrating through the films are various under driving of a preset driving force; and for films made of the same material, the speed of the probe 31 penetrating through the films are the same under driving of the preset driving force.

The speed detection module 32 is used for monitoring the speed of the probe 31 in real-time and transmitting it to the judgement unit 4, so that the judgement unit 4 can judge the damaged condition of the substrate to be detected based on the variation of the speed of the probe 31. For example, a speed sensor may be used as the speed detection module 32.

In the detection device for detecting the damaged condition of a substrate of the present embodiment, the probe unit 3 may further includes a position obtaining module 34, which is used for obtaining a position where the probe 31 just contacts with the substrate to be detected, so that a plane including the position where the probe 31 just contacts with the substrate and parallel to the surface of the substrate to be detected is served as a reference plane, which is an initial plane when a position to be detected of the substrate to be detected is detected by using the probe 31, thereby ensuring that the initial position of the probe 31, from which the probe 31 starts to move toward the substrate, is located on the same plane in each detection process. By using the position obtaining module 34, the positions of film and base can be determined, so that the damaged condition (film damage or base damage) of the substrate to be detected can be determined by cooperation of the speed detection module 32, and on the other hand, it can be ensured that the probe 31 will not damage the base of the substrate, i.e., by using the position obtaining module 34, damages to the base of the substrate caused by the probe 31 can be avoided. In addition, by setting the initial plane for detecting, by using the probe 31, the position to be detected of the substrate to be detected, the probe 31 can be driven by a relative large driving force so as to reach to the initial plane quickly, thereby reducing set-up time before detection and improving detection efficiency.

The judgement unit 4 is used for judging damaged condition at a relevant position of the substrate to be detected based on the real-time speed of the probe 31 moving in the substrate to be detected. Firstly, the judgement unit 4 is stored in advance with a speed information table, which has a speed range of the probe 31 under a single driving force condition; alternatively, the speed information table further has a plurality of speed ranges of the probe 31 under a plurality of driving force conditions respectively. That is to say, the speed information table is stored therein with speed information of the probe 31 collected under a certain driving force condition. Then, referring to the speed information table, the judgement unit 4 judges the damaged condition of the substrate to be detected based on the obtained real-time speed of the probe 31 moving in the substrate to be detected.

Figure 3A:
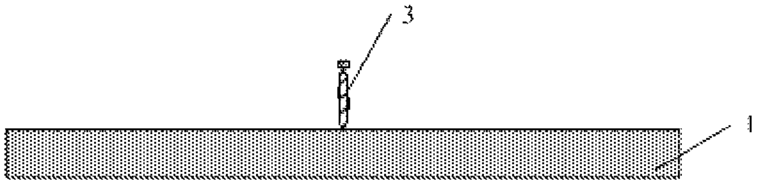
FIG. 3A is a schematic diagram showing obtaining a value of a driving force that will not cause a probe to damage a base.
Figure 3B:
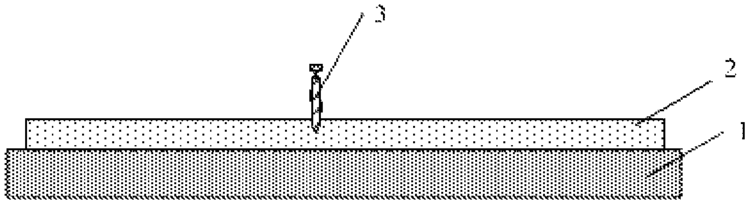
FIG. 3B is a schematic diagram showing obtaining a movement speed of the probe in a film.

Specifically, referring to FIG. 3A and FIG. 3B, taking that a substrate is provided with a single film 2 on a base 1 as an example, formation of the above speed information table includes the following steps of 1) to 4).

1) Preparing a plurality of sample substrates not provided with a film and without damage and a plurality of sample substrates provided with a film and without damage.

For example, mother glasses may be served as the sample substrates not provided with a film and without damage, and substrates provided with the film 2 formed by different materials on the base 1 may be served as the sample substrates provided with a film and without damage. The film 2 may be a photoresist film or the like, and will not be limited herein.

2) Determining a value F of a driving force, wherein when the probe 31 is driven by the driving force having the value F, the sample substrate not provided with a film and without damage will not be damaged when the probe 31 contacts with the sample substrate.

Specifically, the value F is obtained by experimental test, so that in a case where the probe 31 is driven by the driving force having the value F, the sample substrate not provided with a film and without damage will not be damaged when the probe 31 moves toward the sample substrate and contacts with the surface of the sample substrate in a direction vertical to the surface of the sample substrate, and at this time, the speed of the probe 31 is changed to 0 and is still on the surface of the sample substrate, as shown in FIG. 3A.

3) As shown in FIG. 3B, the probe 31 is driven by the driving force having the above value F, moves toward the sample substrate provided with a film and without damage (i.e., the sample substrate provided with the film 2 on the base 1) in a direction vertical to the surface of the sample substrate, and penetrates through the film 2, so as to obtain a speed of the probe 31 moving within the film 2 under driving of the driving force having the value F.

For example, step 3) may be repeated on the sample substrates with the films 2 made of different materials respectively under condition of the driving force having the value F, so as to obtain speeds of the probe 31 moving within the films 2 made of different materials respectively under the driving of the driving force having the value F, thereby obtaining a speed range, within which the probe 31 moves within the films 2, corresponding to the driving force having the value F. The value F is stored in the speed information table in association with the speed range.

Similarly, a plurality of speed ranges, within which the probe 31 moves within the film 2 under a plurality of driving force conditions respectively, can be obtained and stored in the speed information table. Obviously, each of the plurality of driving forces should fulfil a requirement that the probe 31 will not damage the sample substrate not provided with a film and without damage under the driving of the driving force.

4) The speed information table is stored in the judgement unit 4, so as to be referred when detecting damaged condition of a damaged substrate to be detected. The judgement unit 4 may be, for example, a computer with a data processing function.

Correspondingly, the present embodiment further provides a detection method for detecting damaged condition of a substrate by using the above-described detection device. The substrate to be detected includes a base 1 and a film 2 provided on the base 1, and generally, the substrate to be detected is a substrate having been damaged but whether the damaged condition thereof is film damage or base damage cannot be determined.

Specifically, the detection method for detecting damaged condition of a substrate includes the following steps.

Firstly, placing a damaged substrate to be detected into the detection device, and determining the damaged position.

Figure 4A:
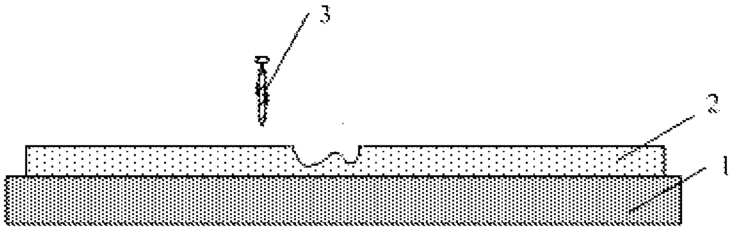
FIG. 4A is a schematic diagram showing step of S1 of a detection method provided by the first embodiment.

Then, a probe mode is enabled, at step S1, a preset driving force is applied to a probe, so that the probe moves toward the substrate to be detected in a direction vertical to the surface of the substrate to be detected, as shown in FIG. 4A.

Figure 1:
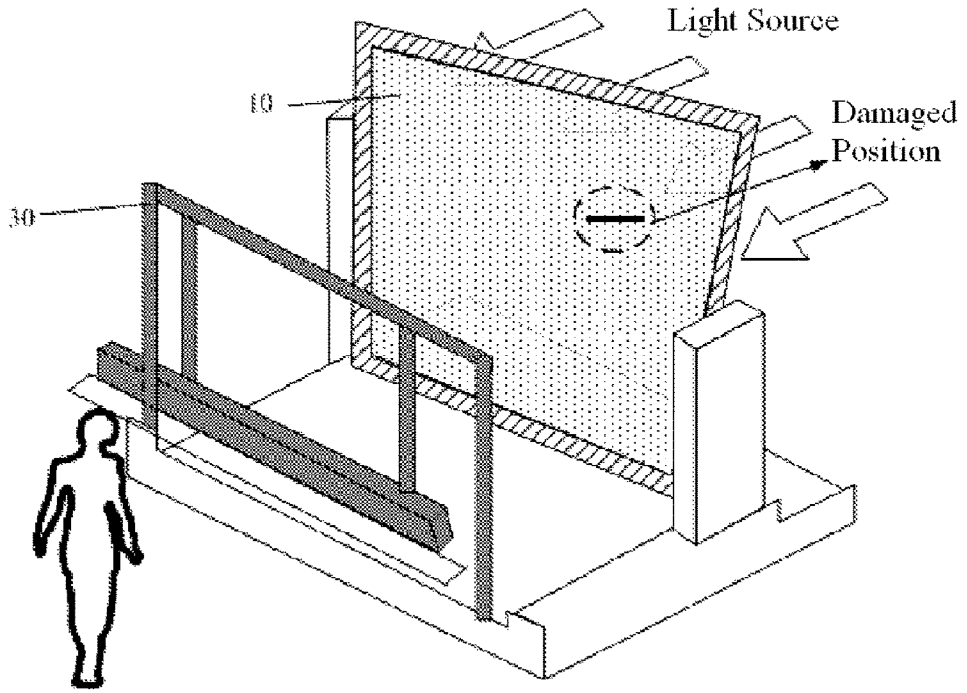
FIG. 1 is a schematic diagram of a detection system for detecting damaged condition of a substrate in the prior art.

In actual applications, FIG. 1 may be referred. The substrate to be detected is vertically placed, and the preset driving force is applied to the probe, so that the probe moves toward the substrate to be detected in the direction vertical to the surface of the substrate to be detected.

Figure 4B:
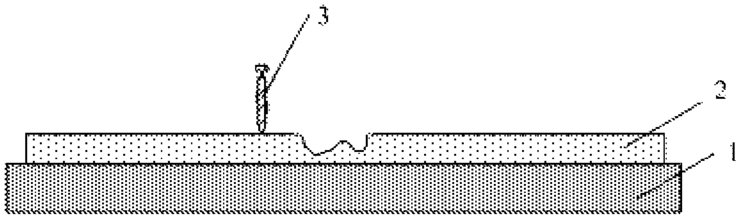
FIG. 4B is a schematic diagram showing obtaining a reference plane in the detection method provided by the first embodiment.

Preferably, before detecting a damaged area of the substrate to be detected by using the probe unit, the method further includes a step of determining a reference plane: applying the same preset driving force as applied in step S1 to the probe, so that the probe moves toward an undamaged area of the substrate to be detected in the direction vertical to the surface of the substrate to be detected, recording a position where the probe just contacts with the substrate to be detected, and using a plane including the position and parallel to the surface of the substrate to be detected as the reference plane. Specifically, as shown in FIG. 4B, an undamaged area of the substrate to be detected is selected, and a preset driving force is applied to the probe so that the probe moves toward the substrate to be detected at a speed of V. When the speed of V is just changed, the probe just contacts with the film 2, i.e., just contacts with the upper surface of the film 2. At this time, the position obtaining module 34 transmit a signal, the judgement unit 4 records this position and the plane including the position and parallel to the surface of the substrate to be detected is served as the reference plane. Subsequently, the preset driving force is applied to the probe, so that the probe moves from the reference plane toward the substrate to be detected in the direction vertical to the surface of the substrate to be detected.

At step S2, the speed of the probe in the process of detection is obtained.

Specifically, in the process of detecting the damaged condition of the substrate to be detected by using the probe unit, for example, the probe moves within the reference plane to a position right above the damaged position, and then moves toward the substrate to be detected under the driving of the preset constant driving force that is the same as applied in step S1. That is to say, according to the reference plane recorded by the judgement unit 4, the probe moves within the reference plane to a position right above the damaged position, and then the probe moves toward the substrate to be detected under the driving of the preset constant driving force. The real-time speed of the probe during movement is obtained by the speed detection module 32 and then transmitted to the judgement unit 4.

At step S3, based on the speed range corresponding to the preset driving force condition in the speed information table, the damaged condition of the substrate to be detected is judged according to the obtained real-time speed of the probe.

Figure 5A:
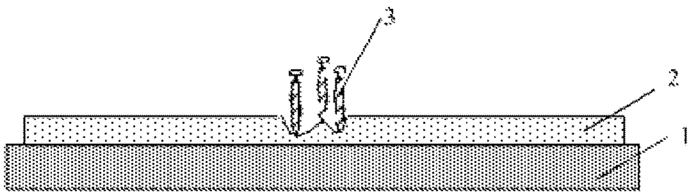
FIG. 5A is a schematic diagram showing a substrate to be detected is judged as a substrate having film damage in step S3 of the detection method provided by the first embodiment.

For example, assuming that the speed of the probe before contacting with the substrate to be detected is V when it is driven by a driving force having a value F, the damaged condition of the substrate to be detected is judged to be film damage and the base is not damaged, in a case where the probe moves toward the substrate to be detected from the reference plane and the obtained real-time speed of the probe is changed to 0 after being subject to the speed range corresponding to the driving force having the value F in the speed information table. That is to say, it is determined that the probe firstly contacts with the film 2 during movement, as shown in FIG. 5A, and the base 1 is undamaged. In this case, the film 2 on the base 1 can be removed, and then the base 1 can be reused.

Figure 5B:
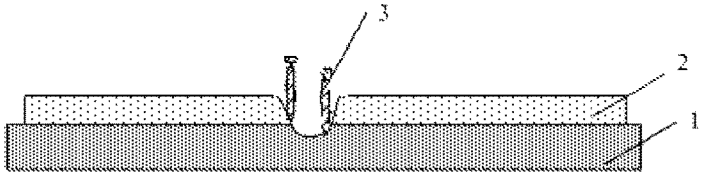
FIG. 5B is a schematic diagram showing a substrate to be detected is judged as a substrate having base damage in step S3 of the detection method provided by the first embodiment.

Correspondingly, the damaged condition of the substrate to be detected is judged to be base damage, in a case where the speed of the probe is directly changed to 0 without being subject to the speed range corresponding to the driving force having the value F in the speed information table. That is to say, the base 1 has been damaged, as shown in FIG. 5B. In this case, the substrate to be detected has to be rejected immediately, so as to ensure that the substrate with a damaged base will not go through the important apparatus with high precision and high cost such as coating machine and exposing machine.

Here, it should be understood that, in the above process of detecting the damaged condition of the substrate, the specific value of the speed of the probe moving within the substrate to be detected (i.e., moving within the film 2) is less important. It is critical to determine whether the speed of the probe is subject to a certain speed range before changing to 0 during movement. If the speed of the probe is subject to a certain speed range before changing to 0, then it is judged that the damaged condition of the substrate to be detected is the film damage, and if the speed of the probe is directly changed to 0, then it is judged that the damaged condition of the substrate to be detected is the base damage.

Also, it should be understood that, in the above process of detecting the damaged condition of the substrate, a damaged condition in which the film 2 on the base 1 is completely damaged while the base 1 is undamaged is deemed as base damage. By judging the damaged condition of the substrate in this manner, the substrate with a chance to have a damaged base can be prevented from entering the subsequent processing apparatuses. The cost of the base is much lower than the cost of important processing apparatuses. By employing strict judging criteria, it can be ensured that the processing apparatus will not be affected by fragments caused by base damage, so that maintenance cost of the processing apparatus is reduced.

According to the detection device and detection method for detecting damaged condition of the substrate provided by the present embodiment, whether the damaged condition of the substrate is film damage or base damage can be determined accurately by detecting the variation of the speed of the probe in the process of detection under a constant driving force condition. The detection device has a simple structure, the detection method is convenient, prompt and accurate, and the impacts on the important apparatuses caused by the substrate having a damaged base can be prevented.

The detection device and detection method for detecting damaged condition of the substrate provided by the present embodiment is suitable for detecting and judging damaged condition of a substrate in the field of display technology. The films formed on the substrate to be detected may include photoresist film and color resin film in the color filter substrate, metal film and metal oxide film in the array substrate, and the like.

Second Embodiment

The present invention provides a detection device for detecting damaged condition of a substrate. Compared to the first embodiment, the position obtaining module may be omitted. Correspondingly, the step of obtaining the reference plane may be omitted in the detection method provided by this embodiment, which is used for detecting damaged condition of a substrate.

The detection device and detection method for detecting damaged condition of a substrate provided by the present embodiment are suitable for batch-type substrate detection, and substrates in each batch have the same thicknesses of film and base with each other. In this case, the position of the reference plane can be measured in advance and then pre-stored in a judgement unit, so that the position of the reference plane is not necessary to be obtained through the position obtaining module before each time of detection. Therefore, the efficiency of detection is improved and the structure of the detection device is simplified.

The other structures of the detection device for detecting damaged condition of a substrate provided by the present embodiment are the same as these of the first embodiment and the other steps of the detection method for detecting damaged condition of a substrate provided by the present embodiment are the same as these of the first embodiment, and will not be repeated here.

Third Embodiment

The present embodiment provides a detection system for detecting damaged condition of a substrate, which includes the detection device provided by the first or second embodiment.

Figure 6:
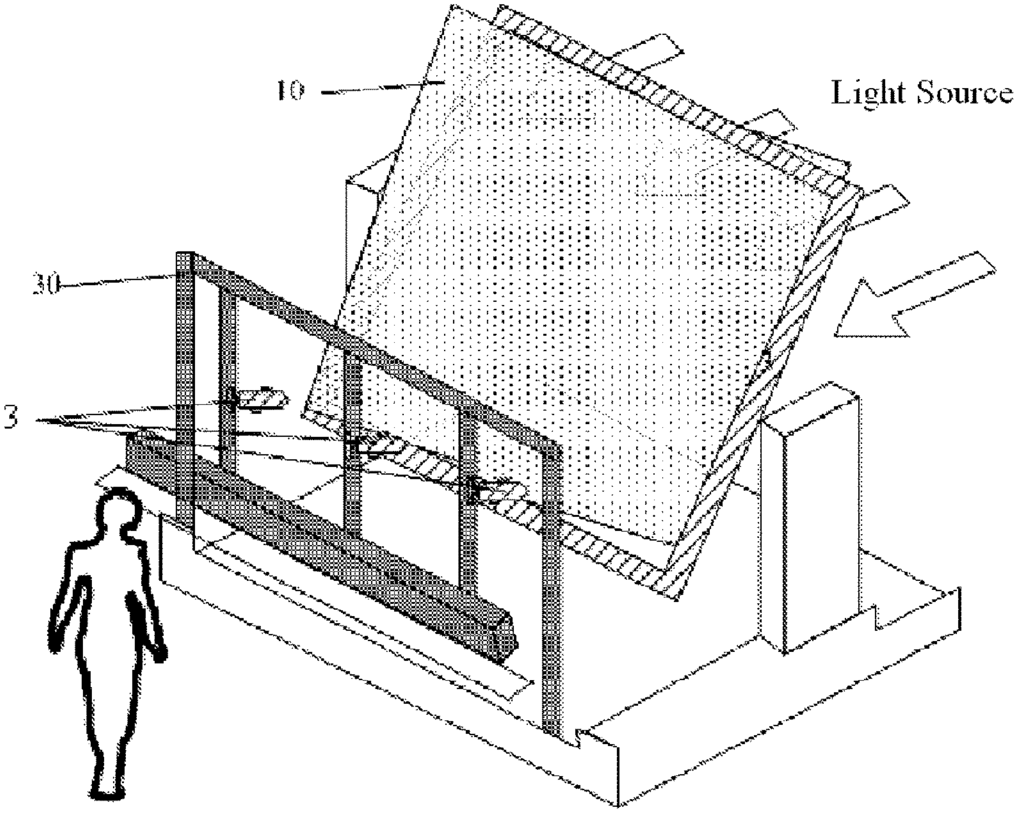
FIG. 6 is a structural diagram of a detection system in a third embodiment of the present invention.

As shown in FIG. 6, in the present embodiment, the detection system may be a macro detection machine added with one or more detection device for detecting damaged condition of a substrate according to the first or second embodiment. The detection system includes an operation station (OP) and a holding unit. The probe unit 3 of the detection device for detecting damaged condition of a substrate is provided at the front end of the operation station and can move freely in two directions (e.g., X axis and Y axis) vertical to each other with respect to the operation station. A substrate 10 to be detected is placed within the holding unit and is capable of rotating within the holding unit (as shown in FIG. 6, the substrate 10 to be detected has rotated to a certain angle with respect to the holding unit), so that the substrate 10 to be detected can be completely detected. In addition, the detection method corresponding to the detection device according to the above embodiments has been added to the software in the control host of the macro detection machine.

Specifically, the detection system includes a support 30 located at the front end of the operation station and is provided with a magnifier, which is used for magnifying the substrate to be detected. In this embodiment, the probe units 3 can be directly provided on the support 30 in an interval manner, and the probe units 3 are capable of moving in X and Y directions along with the support 30, so as to detect the damaged condition of the substrate to be detected. In this case, the structure of the macro detection machine is only slightly changed, so that the cost of the machine is only slightly increased.

In this embodiment, the detection system not only can detect whether the substrate is damaged, but also can accurately determine whether the damaged condition is film damage or base damage. It has high level of automation and high accuracy, so that the impact on the subsequent production line caused by damaged base can be effectively avoided.

It can be understood that, the foregoing implementations are merely the exemplary embodiments for the purpose of explaining the principle of the present invention, but the present invention is not limited thereto. For those skilled in the art, various modifications and improvements can be made without departing from the spirit and essence of the present invention, and, these modifications and improvements also fall within the protection scope of the present invention

What is claimed is:

1. A detection device, which is used for detecting damaged condition of a substrate, the substrate to be detected includes a base and a film provided on the base, the detection device includes a probe unit and a judgement unit, and the probe unit includes a probe, a speed detection module and a driving force control module both provided on the probe, wherein a bottom end of the probe is used for contacting with the substrate to be detected;

the speed detection module is used for obtaining a real-time speed of the probe in a process of detection and transmitting the real-time speed to the judgement unit;

the driving force control module is used for applying a constant driving force to the probe; and the judgement unit is used for receiving the real-time speed of the probe and judging the damaged condition of the substrate to be detected in accordance with the real-time speed of the probe.

2. The detection device according to claim 1, wherein the probe unit further includes a position obtaining module, which is used for obtaining a position where the probe just contacts with the substrate to be detected at a surface of the substrate to be detected, so that a plane including the position and parallel to the surface of the substrate to be detected is served as a reference plane, which is an initial plane when a position to be detected of the substrate to be detected is detected by using the probe.

3. The detection device according to claim 1, wherein the judgement unit is stored in advance with a speed information table, which has a speed range of the probe under a single driving force condition; or the speed information table has a plurality of speed ranges of the probe under a plurality of driving force conditions respectively.

4. The detection device according to claim 2, wherein the judgement unit is stored in advance with a speed information table, which has a speed range of the probe under a single driving force condition; or the speed information table has a plurality of speed ranges of the probe under a plurality of driving force conditions respectively.

5. The detection device according to claim 3, wherein the speed range under one or a plurality of driving force conditions in the speed information table is obtained by the following steps of:

preparing a plurality of sample substrates not provided with a film and without damage and a plurality of sample substrates provided with a film and without damage;

determining a value of a driving force, wherein when the probe is driven by the driving force having the value to move toward the sample substrate not provided with a film and without damage, the sample substrate not provided with a film and without damage will not be damaged when the probe contacts with the sample substrate;

driving, under the driving force having the value, the probe to move toward the sample substrate provided with a film and without damage and penetrate through the film;

obtaining, under the driving of the driving force having the value, a plurality of speeds of the probe moving within films made of different materials respectively, so as to form a speed range; and storing the value of the driving force in the speed information table in association with the speed range.

6. The detection device according to claim 4, wherein the speed range under one or a plurality of driving force conditions in the speed information table is obtained by the following steps of:

preparing a plurality of sample substrates not provided with a film and without damage and a plurality of sample substrates provided with a film and without damage;

determining a value of a driving force, wherein when the probe is driven by the driving force having the value to move toward the sample substrate not provided with a film and without damage, the sample substrate not provided with a film and without damage will not be damaged when the probe contacts with the sample substrate;

driving, under the driving force having the value, the probe to move toward the sample substrate provided with a film and without damage and penetrate through the film;

obtaining, under the driving of the driving force having the value, a plurality of speeds of the probe moving within films made of different materials respectively, so as to form a speed range; and storing the value of the driving force in the speed information table in association with the speed range.

7. The detection device according to claim 1, wherein the probe is made of a diamond material.

8. A detection system, which include the detection device for detecting damaged condition of a substrate according to claim 1.

9. The detection system according to claim 8, wherein the detection system includes an operation station, wherein the probe unit of the detection device is provided at a front end of the operation station and is capable of moving freely in two directions vertical to each other with respect to the operation station.

10. The detection device according to claim 1, wherein the judgement unit judges the damaged condition of the substrate to be detected in accordance with variation mode of the real-time speed.

11. The detection device according to claim 10, wherein the variation mode includes a first mode and a second mode different from the first mode, and wherein the judgement unit judges that the substrate to be detected has a damage on the film and has no damage on the base when the variation mode is the first mode, and judges that the substrate to be detected has a damage on the base when the variation mode is the second mode.

* * * * *